(12) United States Patent
Lindsay

(10) Patent No.: US 7,514,317 B2
(45) Date of Patent: Apr. 7, 2009

(54) STRAINED SEMICONDUCTOR DEVICE AND METHOD OF MAKING SAME

(75) Inventor: Richard Lindsay, Fishkill, NY (US)

(73) Assignee: Infineon Technologies AG, Munich (DE)

(*) Notice: Subject to any disclaimer, the term of this patent is extended or adjusted under 35 U.S.C. 154(b) by 92 days.

(21) Appl. No.: 11/521,804

(22) Filed: Sep. 15, 2006

(65) Prior Publication Data
US 2008/0122000 A1 May 29, 2008

Related U.S. Application Data

(60) Provisional application No. 60/841,601, filed on Aug. 31, 2006.

(51) Int. Cl.
*H01L 21/8242* (2006.01)

(52) U.S. Cl. ............ 438/248; 438/391; 438/FOR. 238; 257/18; 257/E21.545; 257/E21.551

(58) Field of Classification Search .................. 438/248, 438/391, FOR. 238; 257/18, E21.545, E21.551
See application file for complete search history.

(56) References Cited

U.S. PATENT DOCUMENTS

| | | | |
|---|---|---|---|
| 6,979,627 B2 | 12/2005 | Yeap et al. | |
| 7,002,209 B2 * | 2/2006 | Chen et al. | 257/336 |
| 7,012,028 B2 * | 3/2006 | Bu et al. | 438/733 |
| 7,256,081 B2 * | 8/2007 | Yang et al. | 438/184 |
| 7,384,833 B2 * | 6/2008 | Polishchuk et al. | 438/197 |
| 2002/0045325 A1 | 4/2002 | Kuhn et al. | |
| 2005/0051867 A1 | 3/2005 | Lee et al. | |
| 2006/0035425 A1 * | 2/2006 | Carter et al. | 438/199 |
| 2006/0040462 A1 | 2/2006 | Wu et al. | |
| 2007/0138564 A1 * | 6/2007 | Lim et al. | 257/369 |

* cited by examiner

*Primary Examiner*—Thanh V Pham
(74) *Attorney, Agent, or Firm*—Slater & Matsil, L.L.P.

(57) ABSTRACT

A method of making a semiconductor device is disclosed. A semiconductor body, an STI region, a gate and a silicided source/drain region are provided. The STI area is etched, and a liner is formed at the upper surface.

29 Claims, 7 Drawing Sheets

STRAINED SEMICONDUCTOR DEVICE AND METHOD OF MAKING SAME

This application claims the benefit of U.S. Provisional Application No. 60/841,601, filed on Aug. 31, 2006, entitled "Strained Semiconductor Device and Method of Making Same", which application is hereby incorporated herein by reference.

CROSS-REFERENCE TO RELATED APPLICATIONS

This application relates to the following co-pending and commonly assigned patent applications: Ser. No. 11/521,802, filed Sep. 15, 2006; and Ser. No. 11/521,809, filed Sep. 15, 2006, which applications are hereby incorporated herein by reference.

TECHNICAL FIELD

This invention relates generally to semiconductor devices and methods, and more particularly to devices and methods for modulating stress in transistors in order to improve performance.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. In addition, higher conductivity materials, such as copper, are replacing lower conductivity materials, such as aluminum. One other challenge is to increase the mobility of semiconductor carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility and performance boost of devices. For example, stress can be provided by a contact etch stop layer (CESL), otherwise known as a stressed CA liner, stress memory transfer layers, and STI liners. The CA liners can be continuous over the wafer (single CA liner). For both pMOS and nMOS improvement, however, one would need a different CA liner for each (dual stressed CA liner). Most of these techniques use nitride layers to provide tensile and compressive stresses; however, other materials can be used in other applications, e.g., HDP oxide layers.

Another method for inducing strain into the transistor utilizes a modified shallow trench isolation (STI) region. One method includes lining an STI recess with a stressor before filling the recess with a dielectric. The stressor can then impart a stress onto the adjacent semiconductor.

In the field of small, densely packed applications using small geometry CMOS transistors, however, the use of stressed CA liners in the STI region becomes challenging because the smaller the area that can be devoted to the CA liner, the less effective the liner is at delivering a sufficient amount of channel stress.

SUMMARY OF THE INVENTION

In one embodiment of the present invention, a method of making a semiconductor device, a semiconductor body, an STI region, a gate and a silicided source/drain region is provided. The STI region is etched, and a liner is formed at the upper surface.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for improving carrier mobility in a CMOS device. Concepts of the invention can also be applied, however, to other electronic devices. As but one example, bipolar transistors (or BiCMOS) can utilize concepts of the present invention.

Figure 1:
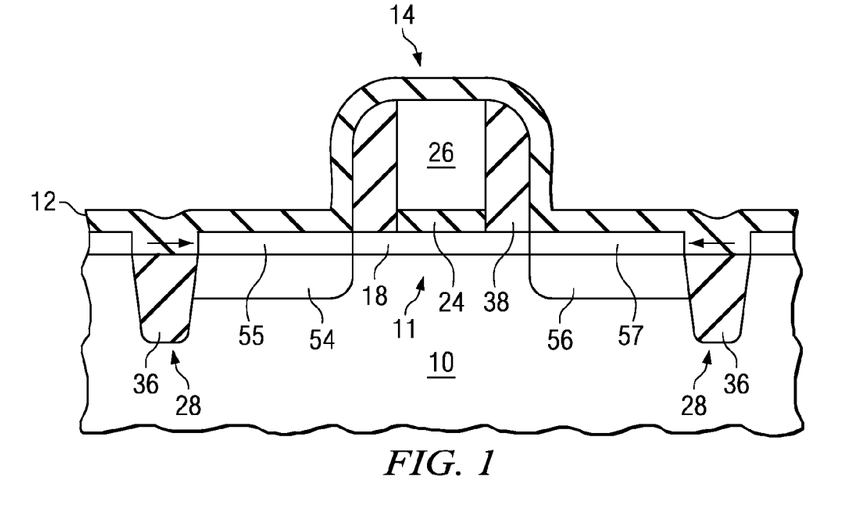
FIG. 1 illustrates a transistor device fabricated using concepts of the present invention.

FIG. 1 shows a present embodiment of the present invention, wherein a transistor device 14 is formed in the semiconductor body 10. In particular, the upper surface of the silicided source and drain regions 54/56, 55/57 is stressed by the formation of stress layer 12. This stress layer 12 can be fabricated with a nitride, as an example. In other embodiments, other materials can be used. As shown in FIG. 1, the stress layer 12 is applied to vertical surfaces of the active area as well as over the horizontal surface. In the preferred embodiment, the STI regions 36 are etched away to a depth of between 30 nm and 300 nm, typically 100 nm prior to the application of the stress liner 12.

The more surface area of the stress liner that can come in contact with the semiconductor body 10, the more stress that can be made available to active area 11. In addition, a local topography (e.g., near 90 degree edges) is preferable to transfer maximum stress from the liner to the silicon. In theory, if given a flat film, each point in the film will have a force pushing from the left and the right on the silicon, whereas at a 90° edge, there is only force in one direction (the other part is missing). This is shown in the FIG. 3 (by the arrows). Thus, for example, a flat, bare silicon wafer simply might not be significantly stressed—only at the wafer edges. From experiment, the stress is highest with maximum topography, with less stress remaining without edges.

The transistor 14 includes a channel region 18 disposed in the semiconductor body 10. Channel region 18 is stressed from the adjacent source/drain regions 54 and 56. A gate dielectric 24 overlies the channel region 18 and a gate electrode 26 overlies the gate dielectric 24. A source region 54 and a drain region 56 are disposed in the semiconductor body and spaced from each other by the channel region 18. Source region 54 and the drain region 56 are silicided to form low resistivity regions 55/57 on the surface. In one example, stress liner 12 is a tensile stress liner and source region 54 and drain region 56 are n+ regions (and the transistor is therefore an n-channel transistor). In another example, stress liner 12 is a compressive stress layer and p+ source region 54 and drain region 56 form a p-channel transistor.

In other embodiments, other semiconductor devices and elements can be fabricated beneath liner 12. For example, if the doped regions 54 and 56 are formed with opposite polarities, the device 14 can be operated as a diode. In another example, the doped regions 54 and 56 can be used as contacts to one plate of a capacitor while the gate electrode 26 is used as another gate of a capacitor. This capacitor could be used, for example, as a decoupling capacitor between supply lines (e.g., $V_{DD}$ and ground) on a semiconductor chip.

FIGS. 2a-2j and FIGS. 3a-3d illustrate various embodiments for forming a semiconductor device of the present invention. While certain details may be explained with respect to only one of the embodiments, it is understood that these details can also apply to other ones of the embodiments.

Figure 2A:
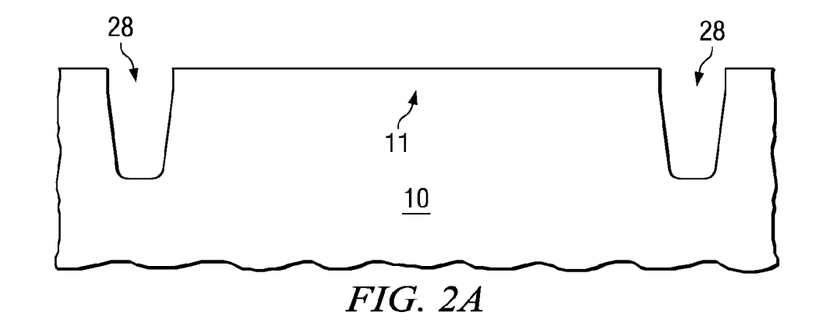
FIGS. 2a-2j provide cross-sectional views of a first embodiment process.

Referring first to FIG. 2a, a semiconductor body 10 is provided. In the preferred embodiment, the semiconductor body 10 is a silicon wafer. For example, the body 10 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer.

In the first embodiment, isolation trenches 28 are formed in the semiconductor body 10. Isolation trenches 28 can be formed using conventional techniques. For example, a hard mask layer (not shown here), such as silicon nitride, can be formed over the semiconductor body 10 and patterned to expose the isolation areas. The exposed portions of the semiconductor body 10 can then be etched to the appropriate depth, which is typically between about 200 nm and about 400 nm. The trenches 28 define active area 11, in which integrated circuit components can be formed.

Figure 2B:
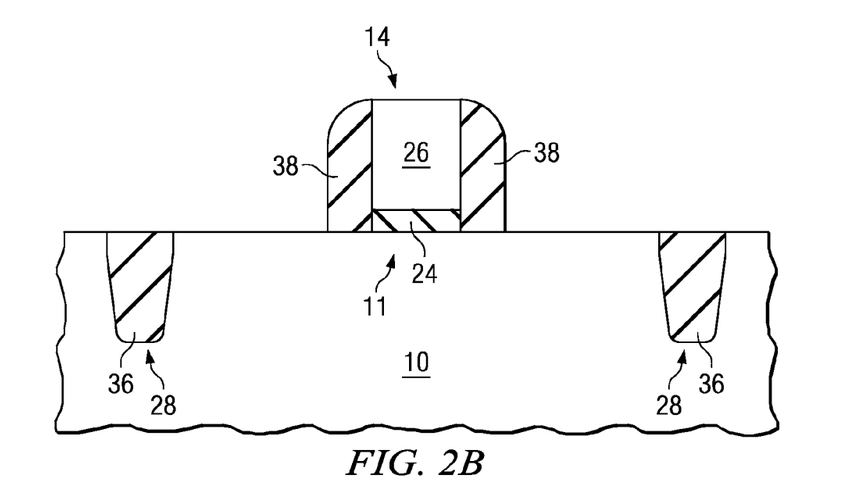

Referring now to FIG. 2b, the trenches 28 are filled with an isolating material 36. For example, exposed silicon surfaces can be thermally oxided to form a thin oxide layer. The trenches 28 can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with newer fill materials (e.g., HARP).

As also shown in FIG. 2b, the gate stack is formed. A gate dielectric 24 is deposited over exposed portions of the semiconductor body 10. In one embodiment, the gate dielectric 24 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 24 can comprise other high-k insulating materials or other dielectric materials. As implied above, the gate dielectric 24 may comprise a single layer of material, or alternatively, the gate dielectric 24 may comprise two or more layers.

The gate dielectric 24 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 24 may be deposited using other suitable deposition techniques. The gate dielectric 24 preferably comprises a thickness of about 10 Å to about 60 Å in one embodiment, although alternatively, the gate dielectric 24 may comprise other dimensions.

In the illustrated embodiment, the same dielectric layer would be used to form the gate dielectric 24 for both the p-channel and n-channel transistors. This feature is not required, however. In alternate embodiments, the p-channel transistors and the n-channel transistor could each have different gate dielectrics.

The gate electrode 26 is formed over the gate dielectric 24. The gate electrode 26 preferably comprises a semiconductor material, such as polysilicon or amorphous silicon, although alternatively, other semiconductor materials may be used for the gate electrode 26. In other embodiments, the gate electrode 26 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 26 comprises a doped polysilicon layer underlying a silicide layer (e.g., titanium silicide, nickel silicide, tantalum silicide, cobalt silicide, or platinum silicide).

If the gate electrode 26 comprises FUSI, for example, polysilicon may be deposited over the gate dielectric 24, and a metal such as nickel can be deposited over the polysilicon. Other metals may alternatively be used. The semiconductor body 10 can then be heated to about 600° C. or 700° C. to form a single layer of nickel silicide. The gate electrode 26 may comprise a plurality of stacked gate materials, such as a metal underlayer with a polysilicon cap layer disposed over the metal underlayer. A gate electrode 26 having a thickness of between about 500 Å to 2000 Å may be deposited using CVD, PVD, ALD, or other deposition techniques.

P-channel and n-channel transistors preferably include gate electrodes 26 formed from the same layers. If the gate electrodes include a semiconductor, the semiconductor can be doped differently for the p-channel transistors and the n-channel transistors. In other embodiments, different types of transistors can include gates of different materials and/or thicknesses.

The gate layer (and optionally the gate dielectric layer) is patterned and etched using known photolithography techniques to create the gate electrode 26 of the proper pattern. After formation of the gate electrodes, lightly doped source/drain regions (not shown) can be implanted using the gate electrode 26 as a mask. Other implants (e.g., pocket implants, halo implants or double diffused regions) can also be performed as desired.

Spacers 38, which are formed from an insulating material such as an oxide and/or a nitride, can be formed on the sidewalls of the gate electrode 26. The spacers 38 are typically formed by the deposition of a conformal layer followed by an anisotropic etch. The process can be repeated for multiple layers, as desired.

Figure 2C:
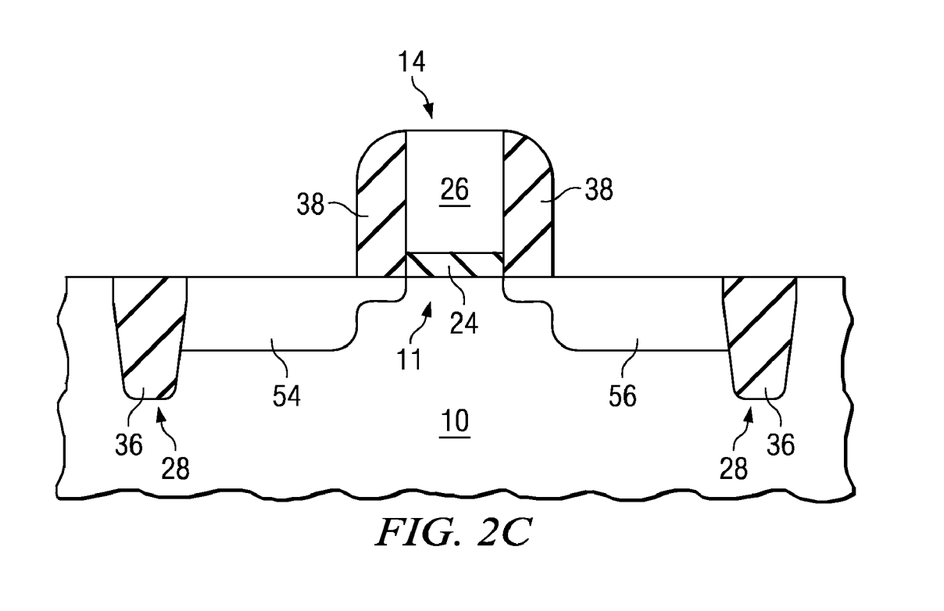

FIG. 2c shows the device after it has been exposed to an ion implant step which forms the source/drain regions 54/56 of the transistor. If a p-type transistor is to be formed, a p-type ion implant is used to form the heavily doped source 54 and drain 56 regions. For example, boron ions can be implanted with a dose of about $1 \times 10^{15}$ cm$^{-2}$ to about $3 \times 10^{15}$ cm$^{-2}$ and an implant energy between about 1 keV and about 5 keV. In other embodiments, other materials, such as $BF_2$ can be implanted. If an n-type transistor is to be formed, an n-type ion implant is used to form the heavily doped source 54 and drain 56 regions. In the preferred embodiment, arsenic or phosphorus ions are implanted into the source/drain regions 54/56. For example, As ions can be implanted with a dose of about $1 \times 10^{15}$ cm$^{-2}$ to about $5 \times 10^{15}$ cm$^{-2}$ and an implant energy between about 5 keV and about 30 keV. In other embodiments, other materials, such as P and Sb can be implanted.

Figure 2D:
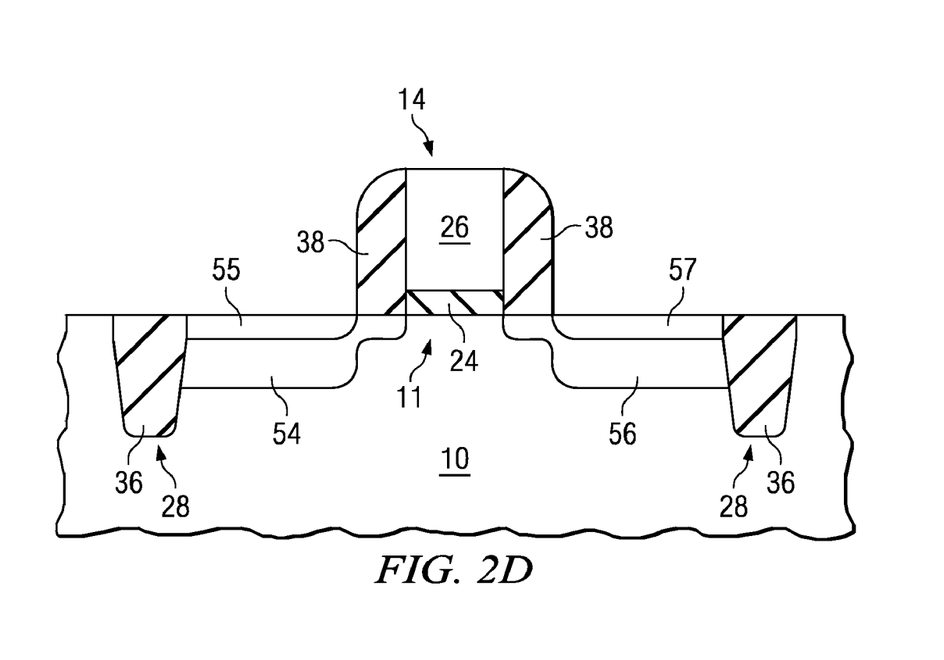

Referring to FIG. 2d, the source 54 and drain 56 regions are silicided to form low resistivity upper surface regions 55 and 57, respectively. Silicide is formed by first depositing a silicidation metal over the source and drain regions, then subjecting the silicon to an annealing process. In the preferred embodiment, the silicidation metal is nickel, but the metal could also be cobalt, copper, molybdenum, titanium, tantalum, tungsten, erbium, zirconium, platinum, or combinations thereof. The semiconductor body 10 is then heated to about 500° C. to form a single layer of nickel silicide.

Figure 2E:
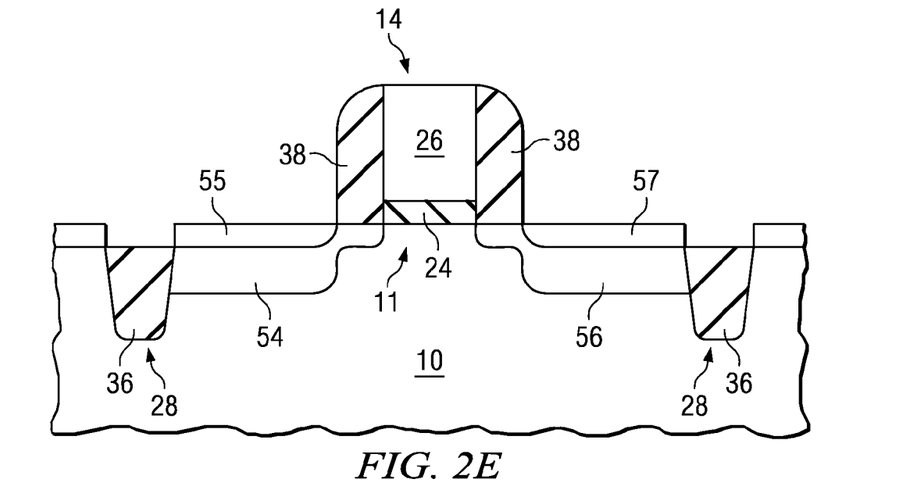

As shown in FIG. 2e, the STI regions 36 are etched to a depth below the upper surface of the substrate 10. As an example, the etching process would include a dilute buffered HF etch that would preferentially etch the STI oxide with little etching of either the spacers or the silicide. The STI liner, if included, is typically very thin (e.g., few nm) so it would not need to be removed for the CA liner 12 to be effective. That being said, any liner (or liners) could be removed.

In one example, the STI regions 36 are etched to a depth of between 30 nm and 200 nm, for example, about 100 nm. In the illustrated example, the STI region 36 extends to first depth (i.e., the depth of trench 28) below the upper surface of the semiconductor body and the upper surface of the recessed STI region extends a second depth lower than the upper surface of the semiconductor body 10. The depth of the source/drain implant 54/56 is the depth at which the carrier concentration drops by two orders of magnitude from the peak concentration.

Figure 2F:
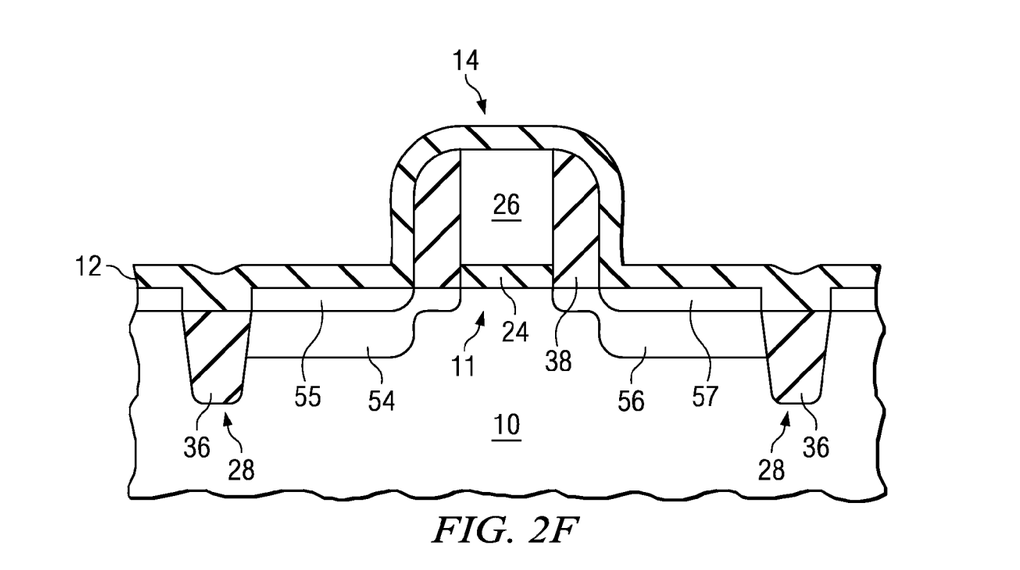

In FIG. 2f, a liner 12 is deposited over the surface of device 14. Liner 12 is preferably a stress-inducing liner, as discussed above. In one particular example, liner 12 is a stress inducing contact etch stop liner (CESL). For example, a nitride film (e.g., silicon nitride) is deposited in such a way as to create a stress between the liner 12 and the underlying semiconductor body 10. For a silicon nitride liner, typically the Si—N to Si—H bonding influences the stress direction—the lower Si—H to Si—N ratio, the more tensile the stress. As is known in the art, deposition rate, pressure, UV curing, and other factors dictate this ratio.

Figure 2G:
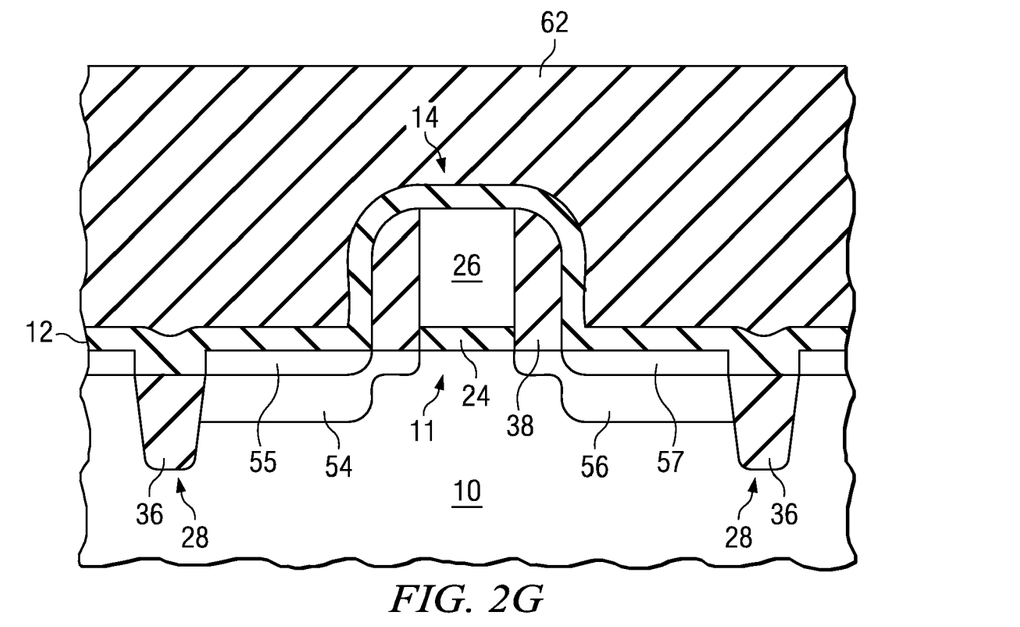

Referring now to FIG. 2g, an interlayer dielectric (ILD) layer 62 is then formed over the CESL 12. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples.

Figure 2H:
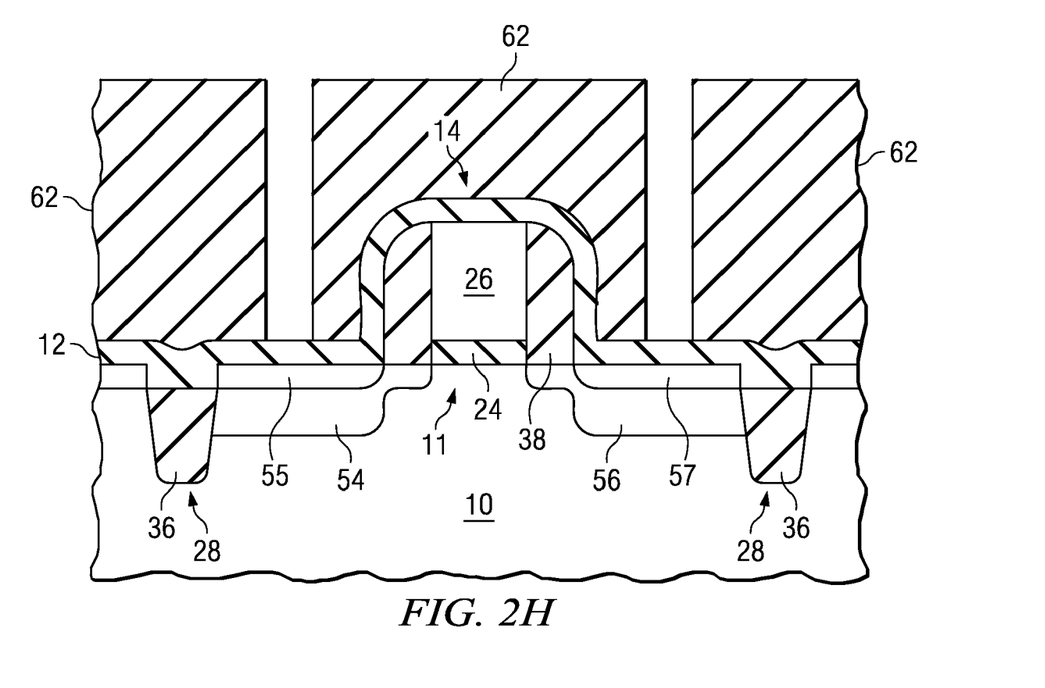
Figure 2I:
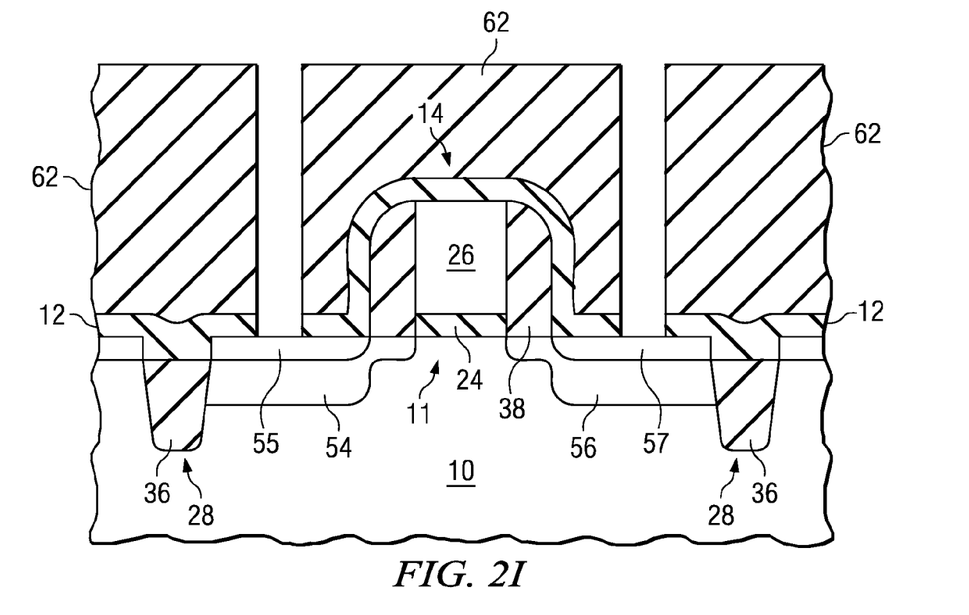

In FIG. 2h, in regions where the contact is to be made, the ILD 62 is etched down to the CESL 12. In one exemplary process, photoresist (not shown) is deposited and patterned to mask off the non-exposed regions to the etch. The ILD 62 is then etched down to the CESL 12 using standard etch techniques. In this step, the ILD 62 etches away at a faster rate than the CESL 12. Once the etch is complete, the photoresist may be removed. A second etch is then performed, as shown in FIG. 2i. This time, the CESL 12 is etched to expose the silicided source/drain regions 55/57 using the ILD 62 as a mask.

Figure 2J:
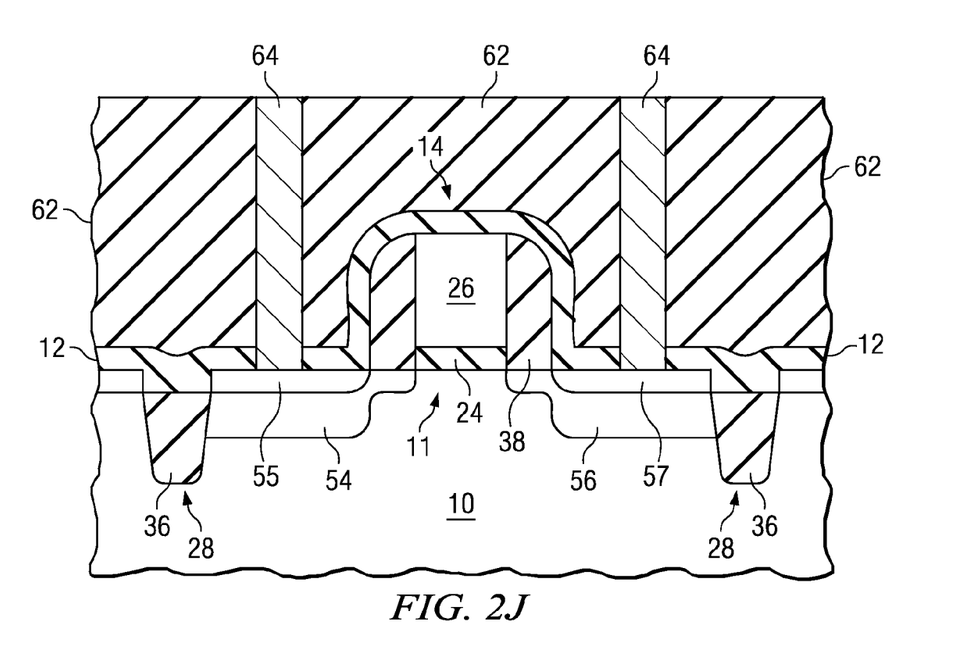

As shown in FIG. 2j, source/drain contacts 64 are formed through the interlayer dielectric by depositing conductive material on the exposed portions of the silicided source/drain regions 55/57. Any standard contact fabrication technique may be used. Typically, a liner, such as Ti/TiN, is deposited to form an ohmic contact, after which tungsten is deposited, e.g., using CVD techniques. An upper surface can then be planarized, e.g., using a chemical-mechanical polish. Metallization layers that interconnect the various components are also included in the chip, but not illustrated for the purpose of simplicity.

A second embodiment of the present invention, shown in FIGS. 3a-3d, can be used with fabrication processes where the STI 36 etch is not very selective to silicide 55/57 and/or spacers 38 (or any other exposed feature). In this embodiment, processing proceeds as in the first embodiment up to and including the formation of silicide on the source/drain regions 54/56 as shown in FIG. 2d.

Figure 3A:
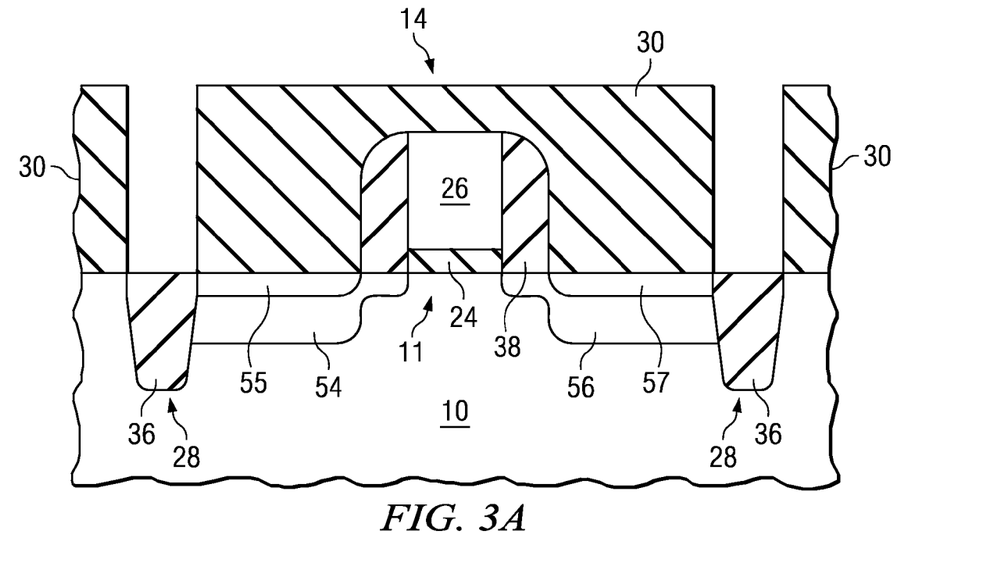
FIGS. 3a-3d provide cross-sectional views of a second embodiment process.

Instead of directly etching STI regions 36, however, resist layer 30 is deposited on device 14 leaving STI regions 36 exposed as shown in FIG. 3a. The resist layer 30 can be any standard positive or negative tone resist. The mask pattern for the resist layer 30 can be the same as was originally used to etch the STI trenches. In this manner, fabrication of a new mask is not necessary. Either some or all of the STI trenches can be exposed during this process. For example, it may be desirable to recess only selected ones of the STI regions of the chip. In one example, the STI regions adjacent only the n-channel devices (or only the p-channel devices) are exposed. For STI regions between the two, only half need to be exposed, in another example.

Figure 3B:
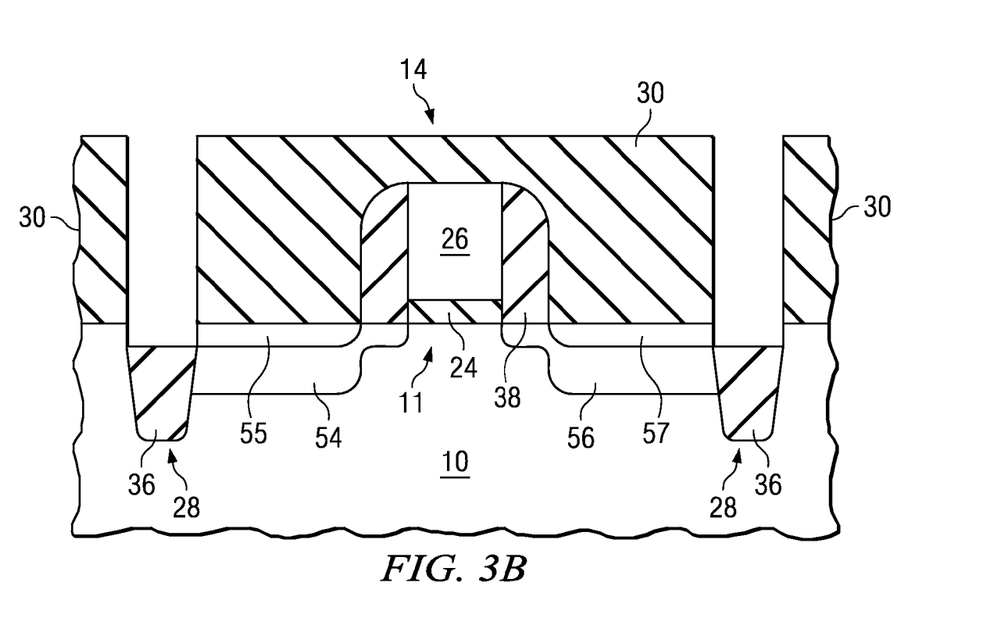
Figure 3C:
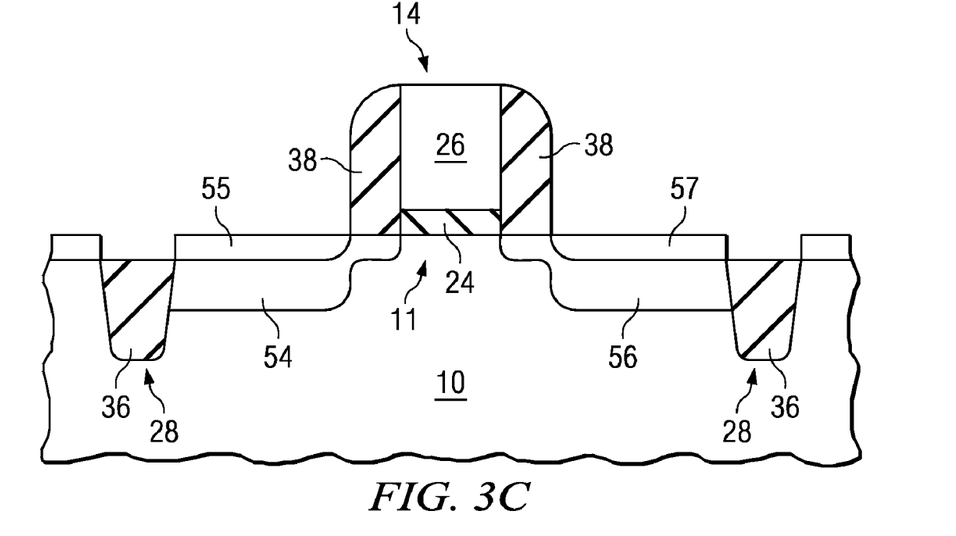

Turning to FIG. 3b, the STI regions 36 are etched to a depth beneath the upper surface of the substrate 10. In this embodiment, the etching process can be performed by, e.g., HF etching. The depth can be selected as discussed above. Once the STI regions are etched, the resist layer 30 is removed, by ashing as an example. The device after the STI etch back is shown in FIG. 3c.

Figure 3D:
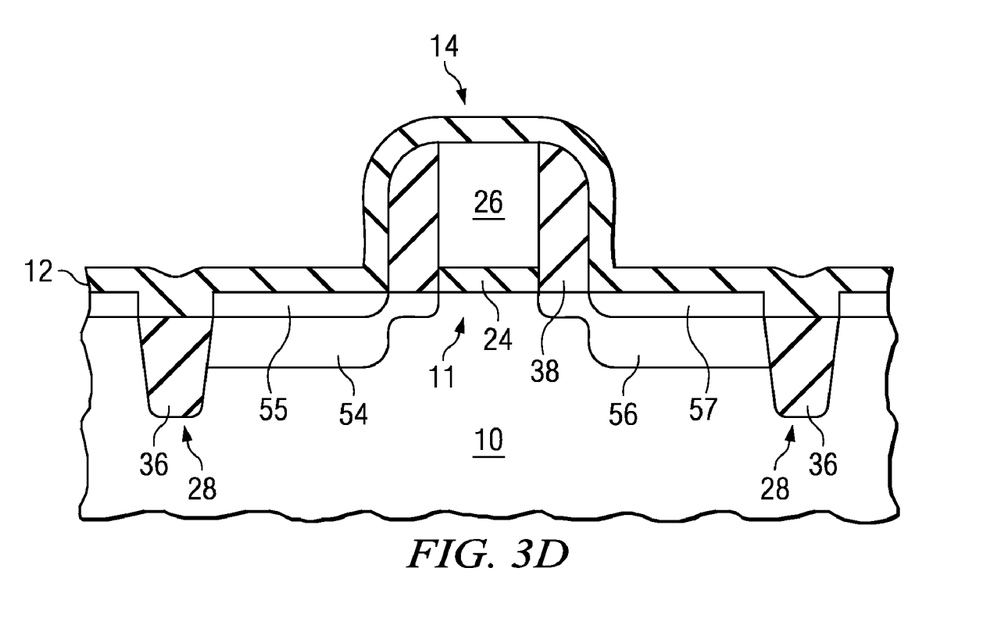

In FIG. 3d, liner 12 is deposited over the surface of device 14. Liner 12 is preferably a stress-inducing CA liner, as discussed above. For example, a nitride film (e.g., silicon nitride) is deposited in such a way as to create a stress between the CA liner 12 and the underlying semiconductor body 10.

After CA liner 12 is deposited, processing continues as is shown in FIGS. 2g-2j as discussed previously herein. As shown in FIG. 2j, an ILD 62 is deposited, contact holes are cut through the ILD 62 and the CESL 12, and metal contacts 64 are fabricated to connect to the silicided source/drain regions 55/57.

One advantage of etching away STI regions 36 prior to the deposition of liner 12 is that it increases the liner area, which increases stress in narrow-featured regions where stress effects would otherwise be diminished. A second advantage is that increasing the liner contact with semiconductor body 10 rather than STI 36 may improve coupling between the stress layer and the source/drain 54/56 and the channel 18 of the device under stress. A third advantage is that the higher vertical component of the liner 12 may be useful for nFET mobility enhancement. A fourth advantage is that curvature in the liner 12 can be used to "pull up" or "push down" the remaining STI 36 to change the stress induced by the STI 36. This may be used to reduce narrow geometry effects.

Embodiments of the present invention can be utilized in conjunction with other stress-inducing techniques. For example, several processes use a known stress memory transfer technique. In this technique, the source/drain regions 54/56 and/or the gate 26 is amorphized. A stress inducing liner is deposited over these regions while they are recrystallized. This technique causes the stress from the liner to remain in the underlying semiconductor, even after the liner is removed. One such example, is shown in co-pending U.S. patent application Ser. No. 11/521,809, which is filed concurrently herewith and is incorporated herein by reference.

Another example of a stress-inducing technique is taught in co-pending U.S. patent application Ser. No. 11/521,802, which is filed concurrently herewith and is incorporated herein by reference. In this application, stress is induced directly into the gate prior to formation of spacers. The process taught in this co-pending application can be utilized in conjunction with the techniques taught herein.

Yet another example of a stress inducing technique is taught in co-pending application Ser. No. 11/354,616, which was filed on Feb. 16, 2006 and is incorporated herein by reference. In this application, stress is induced in active areas prior to the formation of the gate electrodes. Once again, the process taught in this co-pending application can be utilized with the techniques taught herein (including those techniques incorporated by reference). In fact, any of the techniques from these applications can be combined as desired.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   providing a semiconductor body including an upper surface;
   forming an isolation region around an active area of the semiconductor body;
   forming silicide regions on the semiconductor body;
   etching back an upper portion of the isolation region such that an upper surface of the isolation region extends beneath the upper surface of the semiconductor body; and
   depositing a liner over the active area and over the isolation region.

2. The method of claim 1, wherein the liner comprises a stress inducing liner.

3. The method of claim 2, further comprising:
   forming a gate over a portion of the active area; and
   forming source/drain regions in the active area adjacent to the gate.

4. The method of claim 3, wherein the isolation region comprises an STI region.

5. The method of claim 3, wherein the stress inducing liner comprises a contact etch stop layer.

6. The method of claim 5, wherein forming source/drain regions comprises implanting n-type dopants.

7. The method of claim 5, wherein forming source/drain regions comprises implanting p-type dopants.

8. The method of claim 1, wherein etching back the upper portion of the isolation region is performed after forming the silicide regions.

9. A method of making a semiconductor device, the method comprising:
   providing a semiconductor body having an upper surface;
   forming a plurality of isolation trenches in the semiconductor body, the isolation trenches defining at least one active area;
   filling the isolation trenches with a fill material, the fill material extending at least to the upper surface of the semiconductor body;
   forming a gate stack over a portion of the active area;
   forming sidewall spacers adjacent sidewalls of the gate stack;
   forming source/drain regions in the active area adjacent the gate stack;
   etching back the fill material such that an upper surface of the fill material is below the upper surface of the semiconductor body, the etching back being performed using an etch process that etches the fill material selectively with respect to the sidewall spacers;
   after etching back the fill material, forming a liner on the active area and over the isolation trenches;
   forming an interlevel dielectric layer over the liner; and
   etching a contact hole in the interlevel dielectric layer the method further comprising forming silicide regions on the source/drain regions, wherein etching back the fill material is performed after forming the silicide regions.

10. The method of claim 9, wherein the liner is used as an etch stop layer while etching the contact hole, the method further comprising:
    removing an exposed portion of the liner; and
    filling the contact hole with a conductive material.

11. The method of claim 9, wherein the liner comprises a stress inducing liner.

12. The method of claim 11, wherein the liner comprises a compressive stress inducing liner.

13. The method of claim 11, wherein the liner comprises a tensile stress inducing liner.

14. The method of claim 9, wherein the etching back is performed using an etch process that etches the fill material selectively with respect to the silicide regions, and wherein the upper surface of the fill material is about the same or below a lower surface of the silicide regions.

15. A method of making a semiconductor device, the method comprising:
   providing a semiconductor body;
   forming a plurality of isolation trenches in the semiconductor body, the isolation trenches defining at least one active area;
   filling the isolation trenches with a fill material, the fill material extending at least to an upper surface of the semiconductor body;
   forming a gate over a portion of the active area;
   forming source/drain regions in the active area adjacent the gate;
   forming silicide regions on the source/drain regions;
   after forming the silicide regions, forming a mask over the semiconductor body, the mask exposing the fill material;
   etching back the fill material in alignment with the mask such that an upper surface of the fill material is recessed below the upper surface of the semiconductor body; and
   depositing a liner over the active area and the etched back fill material.

16. The method of claim 15, wherein forming a plurality of isolation trenches comprises using a first mask pattern and wherein forming a mask over the semiconductor body comprises using at least a portion of the first mask pattern.

17. The method of claim 15, wherein the plurality of isolation trenches defines a plurality of active areas, and wherein etching back the fill material comprises etching back the fill material adjacent some of the active areas.

18. The method of claim 17, wherein the active areas comprise NMOS active areas and PMOS active areas, and wherein etching back the fill material adjacent some of the active areas comprises etching back the fill material adjacent either the NMOS active areas or the PMOS active areas.

19. The method of claim 15, further comprising removing the mask after etching back the fill material.

20. The method of claim 15 wherein depositing the liner comprises forming a stress inducing liner.

21. The method of claim 15, further comprising:
   forming an interlevel dielectric layer over the liner;
   etching a contact hole in the interlevel dielectric layer using the liner as an etch stop layer;
   removing an exposed portion of the liner; and
   filling the contact hole with a conductive material.

22. The method of claim 15, wherein, after etching back the fill material, the upper surface of the fill material is at least 100 nm lower than the upper surface of the semiconductor body.

23. A method of making a semiconductor device, the method comprising:
   forming a first, a second, and a third isolation trench in a semiconductor body, the first and the second isolation trenches defining a first active area for an NMOS transistor, the second and the third isolation trenches defining a second active area for a PMOS transistor;
   filling the first, the second, and the third isolation trenches with a fill material, the fill material extending at least to an upper surface of the semiconductor body;
   forming first source/drain regions in the first active area;
   forming second source/drain regions in the second active area;
   forming first silicide regions on the first source/drain regions, and second silicide regions on the second source/drain regions;
   after forming the first and the second silicide regions, etching back the fill material in the first isolation trench and in a portion of the second isolation trench adjacent to the first active area; and
   after etching back the fill material, forming a liner over the first active area and over the first isolation trench and the portion of the second isolation trench.

24. The method of claim 23, wherein etching back the fill material comprises etching the fill material selectively with respect to sidewall spacers.

25. The method of claim 23, wherein, after etching back the fill material, the upper surface of the fill material is below the upper surface of the semiconductor body.

26. The method of claim 23, wherein after etching back the fill material, the upper surface of the fill material is below an interface between the first and second silicide regions and the first source/drain regions.

27. The method of claim 23, wherein, after etching back the fill material, the upper surface of the fill material is at least 100 nm lower than the upper surface of the semiconductor body.

28. The method of claim 23, wherein forming the liner fills the etched back portion of the second isolation trench adjacent to the first active area.

29. The method of claim 28, wherein the liner is not formed on the remaining portion of the second isolation trench.

* * * * *

UNITED STATES PATENT AND TRADEMARK OFFICE
CERTIFICATE OF CORRECTION

PATENT NO. : 7,514,317 B2
APPLICATION NO. : 11/521804
DATED : April 7, 2009
INVENTOR(S) : Lindsay

It is certified that error appears in the above-identified patent and that said Letters Patent is hereby corrected as shown below:

In Col. 1, after paragraph (0001), insert the following as paragraph (0002), --The invention claimed herein was made subject to and as a result of a joint research agreement between Infineon Technologies AG and International Business Machines Corporation.--.

In col. 5, line 31, delete "$cm^2$" and insert --$cm^{-2}$--.

Signed and Sealed this

Sixteenth Day of June, 2009

JOHN DOLL
*Acting Director of the United States Patent and Trademark Office*